(12) United States Patent
Jain

(10) Patent No.: US 6,455,426 B1
(45) Date of Patent: Sep. 24, 2002

(54) METHOD FOR MAKING A SEMICONDUCTOR DEVICE HAVING COPPER CONDUCTIVE LAYERS

(75) Inventor: Ajay Jain, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/741,716

(22) Filed: Dec. 19, 2000

(51) Int. Cl.$^7$ ............................................... H01L 21/44
(52) U.S. Cl. .................... 438/687; 438/622; 438/625; 438/631; 438/634; 438/656; 438/660
(58) Field of Search .................. 438/687, 622, 438/623, 624, 625, 626, 627, 628, 634, 635, 636, 638, 642, 644, 645, 660, 633, 631

(56) References Cited

U.S. PATENT DOCUMENTS 6,004,850 A * 12/1999 Lucas et al. ................. 438/301
6,140,237 A * 10/2000 Chan et al. ................. 438/687
6,184,128 B1 * 2/2001 Wang et al. ................. 438/637

* cited by examiner

*Primary Examiner*—Tuan H. Nguyen
*Assistant Examiner*—Thanhha Pham
(74) *Attorney, Agent, or Firm*—Mark V. Seeley

(57) ABSTRACT

A method for making a semiconductor device is described. That method comprises forming a copper containing layer on a substrate, then forming a tantalum containing layer on the copper containing layer. After the tantalum containing layer is oxidized, an etch stop layer may be formed on the oxidized tantalum layer.

15 Claims, 1 Drawing Sheet

METHOD FOR MAKING A SEMICONDUCTOR DEVICE HAVING COPPER CONDUCTIVE LAYERS

FIELD OF THE INVENTION

The present invention relates to semiconductor devices that include copper conductive layers.

BACKGROUND OF THE INVENTION

Semiconductor devices include metal layers that are insulated from each other by dielectric layers. When copper is used to make those metal layers, it may be desirable to form an etch stop layer or layers, e.g., a layer comprising silicon nitride or silicon carbide, on such copper containing layers. Unfortunately, current processes for applying such an etch stop layer to copper containing layers may yield a device with marginal adhesion between those layers, which may degrade electromigration performance.

Accordingly, there is a need for an improved method for making a semiconductor device that includes copper conductive layers. There is a need for such a process that improves adhesion between copper conductive layers and an etch stop layer that is formed on them. The present invention provides such a process.

DETAILED DESCRIPTION OF THE PRESENT INVENTION

A method of forming a semiconductor device is described. That method comprises forming on a substrate a copper containing layer, then forming a tantalum containing layer on the copper containing layer. After oxidizing the tantalum containing layer, an etch stop layer is formed on the oxidized tantalum layer. Set forth below is a description of a number of embodiments for this method of forming a semiconductor device—made with reference to FIGS. 1a–1c. In the following description, numerous specific details are set forth such as material types, dimensions, etc., to provide a thorough understanding of the present invention. However, it will be apparent to those skilled in the art that the invention may be practiced in many ways other than those expressly described here. The invention is thus not limited by the specific details disclosed below.

Figure 1A:
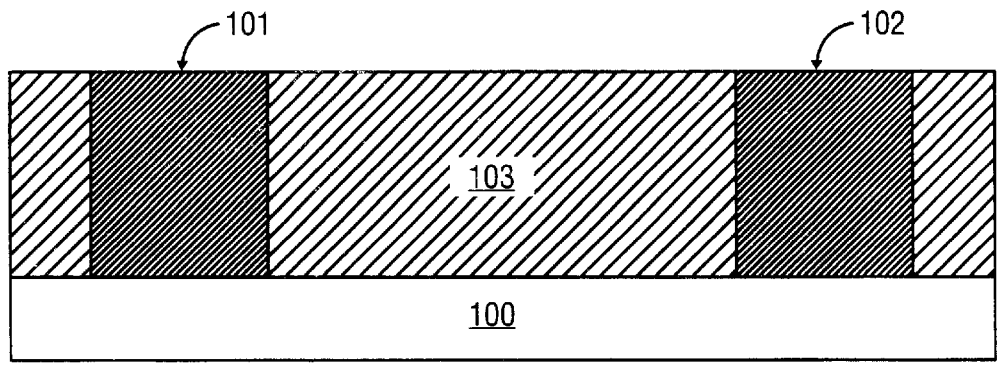
FIGS. 1a–1c illustrate cross-sections of structures that may result when the method of the present invention is used to make a semiconductor device.
Figure 1B:
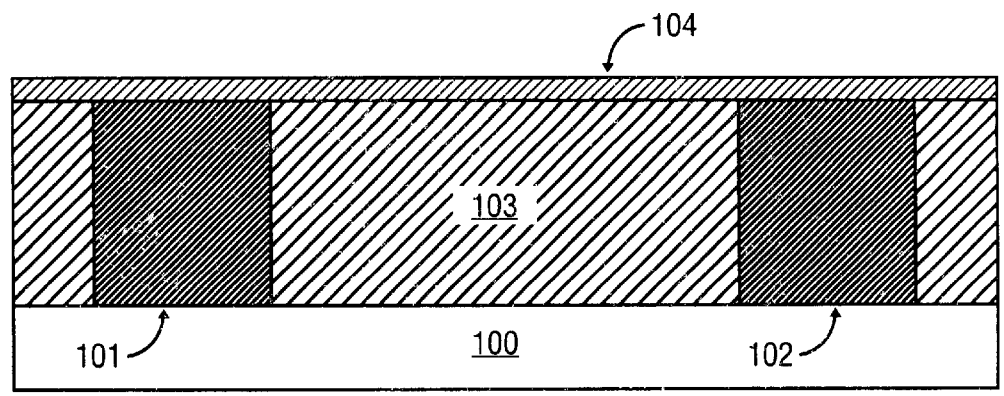
Figure 1C:
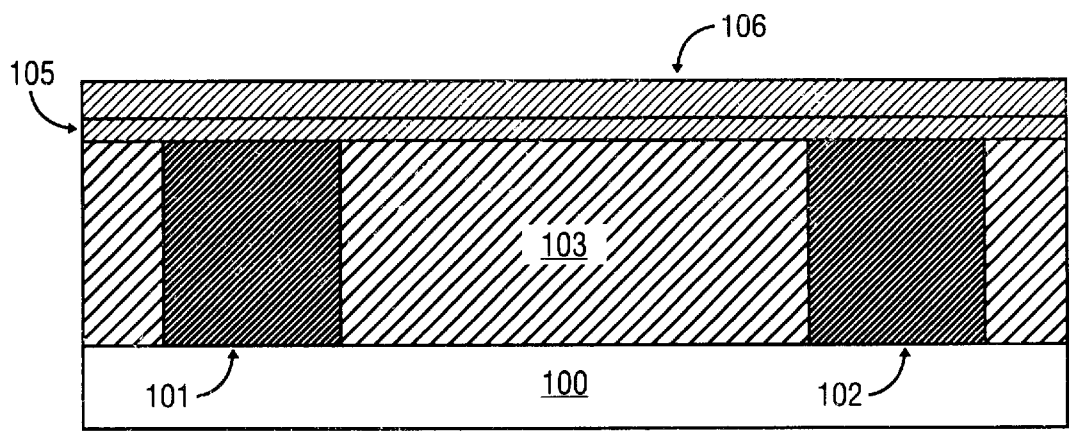

With reference to FIG. 1a, an embodiment of the method for making a semiconductor device of the present invention starts with a structure that comprises copper containing layers 101 and 102 that sandwich dielectric layer 103. Those layers are formed on substrate 100. Substrate 100 may be any surface, generated when making a semiconductor device, upon which a conductive layer may be formed. Substrate 100 may include, for example, active and passive devices that are formed on a silicon wafer such as transistors, capacitors, resistors, diffused junctions, gate electrodes, local interconnects, etc. . . . . Substrate 100 also may include insulating materials (e.g., silicon dioxide, either undoped or doped with phosphorus (PSG) or boron and phosphorus (BPSG); silicon nitride; silicon oxy-nitride; silicon carbide; a carbon doped oxide; or a polymer) that separate such active and passive devices from the conductive layer or layers that are formed on top of them, and may include previously formed conductive layers.

Dielectric layer 103 preferably comprises silicon dioxide, which is deposited on the surface of substrate 100 using a conventional plasma enhanced chemical vapor deposition ("PECVD") process that employs tetraethylorthosilicate (TEOS) as the silicon source. Although preferably made of silicon dioxide, dielectric layer 103 may be made from other materials that may insulate one conductive layer from another, as will be apparent to those skilled in the art. For example, dielectric layer 103 may comprise an organic polymer selected from the group that includes polyimides, parylenes, polyarylethers, polynaphthalenes, and polyquinolines, or copolymers thereof. Alternatively, dielectric layer 103 may comprise fluorinated silicon dioxide or a porous silicon dioxide, e.g., silicon dioxide doped with carbon. Dielectric layer 103 preferably has a thickness of between about 2,000 and about 20,000 angstroms.

Dielectric layer 103 may be formed using conventional deposition techniques, e.g., a conventional spin-on deposition or PECVD process. Copper containing layers 101 and 102 may be formed within dielectric layer 103 in the conventional way, e.g., by etching vias and/or trenches into dielectric layer 103, then filling those etched regions with copper. Layers 101 and 102 may comprise contacts, single damascene interconnects, dual damascene interconnects, or other types of interconnects. Copper containing layers 101 and 102 may be formed using a conventional copper electroplating process, e.g., a process where a copper layer is formed on barrier and seed layers used to line regions that had been etched into dielectric layer 103. The barrier layer may comprise a refractory material, such as titanium nitride, but may also include an insulating material, such as silicon nitride. Suitable seed materials for the deposition of copper include copper and nickel.

When an excess amount of copper is formed on the surface of layer 103, a chemical mechanical polishing ("CMP") step may be applied to remove the excess material and to planarize the surface of layers 101 and 102. When an electroplating process is used to form those copper containing layers, that CMP step removes both the excess copper and the underlying barrier layer. When layer 103 comprises silicon dioxide, that layer provides a CMP stop layer for such a CMP step.

FIG. 1a shows the structure that results after filling regions that were etched into dielectric layer 103 with a copper containing material, then applying a CMP step to remove excess material from the surface of layer 103 to produce copper containing layers 101 and 102. After forming the structure shown in FIG. 1a, tantalum containing layer 104 is formed on copper containing layers 101 and 102, and on dielectric layer 103, to generate the structure shown in FIG. 1b. In a preferred embodiment, tantalum containing layer 104 should be thin enough to completely oxidize, when exposed to air. In a particularly preferred embodiment, tantalum containing layer 104 should be less than about 5 nanometers thick. That layer may be formed using a conventional chemical vapor deposition process, and preferably consists of substantially pure tantalum.

After forming tantalum containing layer 104, the resulting structure is exposed to air to completely oxidize layer 104 to form native dielectric oxide 105. That oxide preferably is between about 2 and about 5 nanometers thick. Native dielectric oxide 105 should adhere to copper layers 101 and 102 in a desirable manner. Following that step, etch stop layer 106, e.g., a layer comprising silicon nitride or silicon carbide, may be formed on oxide 105, to generate the structure shown in FIG. 1c. Etch stop layer 106, like layers 101 and 102, should adhere well to oxide 105.

The method of the present invention thus improves adhesion between etch stop layer 106 and copper containing layers 101 and 102 by forming an intermediate layer, which is sandwiched between those layers, that adheres well to both the etch stop layer and the copper containing layers. Although the foregoing description has specified certain steps, materials, and equipment that may be used in such a method, those skilled in the art will appreciate that many modifications and substitutions may be made. The process of the present invention may improve adhesion between an etch stop layer and a copper containing layer, irrespective of the function that the copper containing layer performs—whether it be a contact, a single damascene interconnect, a dual damascene interconnect, or another type of interconnect. Accordingly, it is intended that all such modifications, alterations, substitutions and additions be considered to fall within the spirit and scope of the invention as defined by the appended claims.

What is claimed is:

1. A method of forming a semiconductor device comprising:
    forming on a substrate a first copper containing layer, a second copper containing layer, and a dielectric layer that is located between the first copper containing layer and the second copper containing layer;
    forming a tantalum containing layer on the first copper containing layer, the second copper containing layer, and the dielectric layer;
    oxidizing the tantalum containing layer; and
    forming an etch stop layer on the oxidized tantalum layer.

2. The method of claim 1 wherein the tantalum containing layer is less than about 5 nanometers thick.

3. The method of claim 2 wherein the etch stop layer comprises silicon nitride.

4. The method of claim 2 wherein the etch stop layer comprises silicon carbide.

5. The method of claim 1 further comprising applying a chemical mechanical polishing step to the first copper containing layer and the second copper containing layer prior to forming the tantalum containing layer on the first copper containing layer and the second copper containing layer.

6. The method of claim 1 wherein the tantalum containing layer is completely oxidized by exposing it to air to form a native dielectric oxide that is between about 2 and about 5 nanometers thick.

7. The method of claim 1 wherein the step of forming a tantalum containing layer on the first copper containing layer, the second copper containing layer, and the dielectric layer forms a layer that consists essentially of tantalum.

8. The method of claim 1 wherein the step of forming on a substrate a first copper containing layer and a second copper containing layer forms layers that consist essentially of copper.

9. The method of claim 1 wherein the first copper containing layer and the second copper containing layer comprise contacts for the semiconductor device.

10. The method of claim 1 wherein the first copper containing layer and the second copper containing layer comprise a single damascene interconnect for the semiconductor device.

11. The method of claim 1 wherein the first copper containing layer and the second copper containing layer comprise a dual damascene interconnect for the semiconductor device.

12. The method of claim 1 wherein the first copper containing layer and the second copper containing layer are formed by:
    forming first and second etched regions in the dielectric layer;
    lining the first and second etched regions with barrier and seed layers; then
    filling the first and second etched regions with a copper containing material; and
    applying a chemical mechanical polishing step to remove excess amounts of copper from the surface of the dielectric layer to form a planarized surface for the first copper containing layer and the second copper containing layer.

13. A method of forming a semiconductor device comprising:
    forming on a substrate a first copper containing layer, a second copper containing layer, and a dielectric layer that is located between the first copper containing layer and the second copper containing layer;
    applying a chemical mechanical polishing step to the first copper containing layer and the second copper containing layer;
    forming a layer that consists essentially of tantalum on the first copper containing layer, the second copper containing layer, and the dielectric layer; and
    exposing the tantalum containing layer to air to completely oxidize it to form a native dielectric oxide that is between about 2 and about 5 nanometers thick.

14. The method of claim 13 further comprising forming an etch stop layer on the native dielectric oxide.

15. The method of claim 14 wherein the etch stop layer comprises a material selected from the group consisting of silicon nitride and silicon carbide.

* * * * *